US007626225B2

(12) United States Patent
Inoue et al.

(10) Patent No.: US 7,626,225 B2
(45) Date of Patent: *Dec. 1, 2009

(54) SEMICONDUCTOR DEVICE INCLUDING NONVOLATILE MEMORY HAVING A FLOATING GATE ELECTRODE

(75) Inventors: Susumu Inoue, Atsugi (JP); Yutaka Maruo, Chino (JP)

(73) Assignee: Seiko Epson Corporation (JP)

( * ) Notice: Subject to any disclaimer, the term of this patent is extended or adjusted under 35 U.S.C. 154(b) by 13 days.

This patent is subject to a terminal disclaimer.

(21) Appl. No.: 11/422,716

(22) Filed: Jun. 7, 2006

(65) Prior Publication Data

US 2006/0278914 A1    Dec. 14, 2006

(30) Foreign Application Priority Data

Jun. 7, 2005    (JP)    ............................. 2005-167119
Jun. 8, 2005    (JP)    ............................. 2005-168339

(51) Int. Cl.
    H01L 29/76    (2006.01)
(52) U.S. Cl. ........................ 257/318; 257/314; 257/316; 257/E29.304
(58) Field of Classification Search ................. 257/315, 257/314, E21.662, E21.679; 365/185.18
    See application file for complete search history.

(56) References Cited

U.S. PATENT DOCUMENTS

| 4,689,653 | A | * | 8/1987 | Miyazaki ..................... 257/373 |
| 4,935,790 | A | | 6/1990 | Cappelletti |
| 5,892,709 | A | | 4/1999 | Parris et al. |
| 6,232,182 | B1 | * | 5/2001 | Sugaya ........................ 438/258 |

(Continued)

FOREIGN PATENT DOCUMENTS

EP    0 496 360    1/1992

(Continued)

OTHER PUBLICATIONS

Richard J. Mcpartland et al., 1.25 Volt, Low Cost, embedded Flash Memory for Low Density Applications, 2000 Symposium on VLSI Circuits Digest of Technical Papers, 2000, pp. 158-161.

*Primary Examiner*—Lynne A. Gurley
*Assistant Examiner*—Vernon P Webb
(74) *Attorney, Agent, or Firm*—Harness, Dickey & Pierce, P.L.C.

(57) ABSTRACT

A semiconductor device including a nonvolatile memory element, the nonvolatile memory element, including:
 a first region, a second region formed adjacent to the first region, and a third region formed adjacent to the second region;
 the nonvolatile memory element further including a semiconductor layer, a separating insulation layer which is formed on the semiconductor layer and which demarcates a forming region of the nonvolatile memory element,
 a first diffusion layer which is formed on the semiconductor layer of the first region,
 a first source region and a first drain region formed on the first diffusion layer,
 a second diffusion layer which is separated from the first diffusion layer and which is formed on a periphery of the first diffusion layer and on the semiconductor layer of the second region,
 a second source region and a second drain region formed on the second diffusion layer,
 a third diffusion layer formed on the semiconductor layer of the third region,
 a first insulation layer formed above the semiconductor layer of the forming region of the nonvolatile memory element, and
 a first conductive layer formed above the first insulation layer.

11 Claims, 7 Drawing Sheets

U.S. PATENT DOCUMENTS

| | | | |
|---|---|---|---|
| 6,324,095 B1 | 11/2001 | McPartland et al. | |
| 6,376,870 B1 | 4/2002 | Carpenter, Jr. et al. | |
| 6,600,205 B2 | 7/2003 | Carpenter, Jr. et al. | |
| 6,631,087 B2 * | 10/2003 | Di Pede et al. | 365/185.18 |
| 6,731,541 B2 * | 5/2004 | Kinsey et al. | 365/185.18 |
| 6,995,436 B2 | 2/2006 | Kawasaki | |
| 2003/0141530 A1 * | 7/2003 | Kaneko et al. | 257/299 |
| 2004/0256658 A1 * | 12/2004 | Park et al. | 257/315 |
| 2005/0012138 A1 | 1/2005 | Endo et al. | |
| 2005/0275009 A1 * | 12/2005 | Maemura et al. | 257/314 |
| 2005/0280065 A1 * | 12/2005 | Iwata et al. | 257/310 |
| 2006/0023509 A1 | 2/2006 | Kodaira | |
| 2006/0055044 A1 | 3/2006 | Maemura | |
| 2006/0273373 A1 * | 12/2006 | Inoue et al. | 257/315 |

FOREIGN PATENT DOCUMENTS

| | | |
|---|---|---|
| JP | 03-270155 | 12/1991 |
| JP | 04-250663 | 9/1992 |
| JP | 07-202141 | 8/1995 |
| JP | 63-166274 | 7/1998 |
| JP | 10-335505 | 12/1998 |
| JP | 2001-185633 | 7/2001 |
| JP | 2002-158291 | 5/2002 |
| JP | 2002-289704 | 10/2002 |
| JP | 2004-363260 | 12/2004 |
| JP | 2005-039067 | 2/2005 |
| JP | 2005-353984 | 12/2005 |
| JP | 2006-48749 | 2/2006 |
| JP | 2006-80323 | 3/2006 |
| JP | 2006080323 A * | 3/2006 |

* cited by examiner (A)

(B)

(C)

(A)

(B)

(C)

SEMICONDUCTOR DEVICE INCLUDING NONVOLATILE MEMORY HAVING A FLOATING GATE ELECTRODE

BACKGROUND OF THE INVENTION

1. Technical Field

The invention relates to a semiconductor device and particularly to a semiconductor device including a nonvolatile memory having a floating gate electrode.

2. Related Art

As one of the nonvolatile memory devices, there is cited a nonvolatile memory device of a stack gate type which is constituted by a floating gate electrode provided on a semiconductor layer through an insulation layer, further, a control electrode provided on the floating gate electrode through the insulation layer, and a source region and a drain region provided on the semiconductor layer. In such nonvolatile memory device of the stack gate type, a write operation and an erase operation are performed by impressing a preset voltage on the control gate and the drain region and by injecting or releasing an electron into or from the floating gate electrode.

However, in such nonvolatile memory device of the stack gate type, there is an increase in a number of steps because of a gate electrode forming step of two times, and it is necessary to form a thin-film insulation layer on the floating gate electrode, so that a manufacturing process becomes cumbersome.

Hence, by comparison to the nonvolatile memory device of the stack gate type, as a nonvolatile memory device which can be manufactured by a simple manufacturing process and at low cost, there is proposed a nonvolatile memory device which is referred to in related art.

The nonvolatile memory device disclosed in JP-A-63-166274 has a control gate which is an n-type impurity region in the semiconductor layer and the floating gate electrode consists of a conductive layer such as a one-layer polysilicon layer (referred to as the "one layer gate type nonvolatile memory device). An advantage of such one-layer gate type nonvolatile memory device is that since there is no need to stack one gate electrode over another gate electrode, it can be formed in the same way as a currently available CMOS transistor process.

JP-A-63-166274 is an example of related art.

SUMMARY

An advantage of some aspects of the invention is to provide a semiconductor device including a nonvolatile memory element which is a one-layer type nonvolatile memory element having a new structure and whose operating characteristics are excellent.

(1) According to a first aspect of the invention, a first semiconductor device includes a nonvolatile memory element, the nonvolatile memory element including: a first region, a second region formed adjacent to the first region, and a third region formed adjacent to the second region, the nonvolatile memory element further including; a semiconductor layer, a separating insulation layer which is formed on the semiconductor layer and which demarcates a forming region of the nonvolatile memory element, a first diffusion layer which is formed on the semiconductor layer of the first region, a first source region and a first drain region formed on the first diffusion layer, a second diffusion layer which is separated from the first diffusion layer and which is formed on a periphery of the first diffusion layer and on the semiconductor layer of the second region, a second source region and a second drain region formed on the second diffusion layer, a third diffusion layer formed on the semiconductor layer of the third region, a first insulation layer formed above the semiconductor layer of the forming region of the nonvolatile memory element, and a first conductive layer formed above the first insulation layer.

According to a first semiconductor device of an aspect of the invention, it is preferable that the first diffusion layer on which the first source region and the first region are formed is provided in separation from the second diffusion layer. Namely, since the first diffusion layer is provided on the semiconductor layer, its junction capacitance is reduced so that voltage resistance of the first diffusion layer can be enhanced.

Note that in an aspect of the invention, when referring to a specified B layer (hereinafter referred to as the "B layer") provided above a specified A layer (hereinafter referred to as the "A layer"), it means a case where the B layer is provided directly above the A layer and a case where the B layer is provided above the A layer through another layer.

In the first semiconductor device according to an aspect of the invention, there may be further aspects as follows:

(2) In the first semiconductor device according to an aspect of the invention, it is preferable that the first diffusion layer has a first conductive type, while the second diffusion layer has a second conductive type.

(3) In the first semiconductor device according to an aspect of the invention, it is preferable that the first source region and the first drain region have the second conductive type, while the second source region and the second source region have the first conductive type.

(4) In the first semiconductor device according to an aspect of the invention, it is preferable that the third diffusion layer has the first conductive type.

(5) In the first semiconductor device according to an aspect of the invention, it is preferable that the third diffusion layer has the second conductive type.

(6) In the first semiconductor device according to an aspect of the invention, it is preferable that the second diffusion layer and the third diffusion layer may be made continuous.

(7) In the first semiconductor device according to an aspect of the invention, it is preferable that a fourth diffusion layer whose impurity concentration is lower than the first diffusion layer is formed in a manner of surrounding the first diffusion layer.

(8) In the first semiconductor device according to an aspect of the invention, it is preferable that the fourth diffusion layer is separated from the second conductive type.

(9) In the first semiconductor device according to an aspect of the invention, it is preferable that the fourth diffusion layer has the first conductive type.

(10) In the first semiconductor device according to an aspect of the invention, it is preferable to include the second insulation layer formed above the first conductive layer and a second conductive layer which is above a region between the first diffusion layer and the second diffusion layer and which is formed above the second insulation layer.

(11) According to a second aspect of the invention, a second semiconductor device includes a nonvolatile memory element, the nonvolatile memory element including: a first region, a second region formed adjacent to the first region, and a third region formed adjacent to the second region; the nonvolatile memory element including; a semiconductor layer, a separating insulation layer which is formed on the semiconductor layer and which demarcates a forming region of the nonvolatile memory element, a first diffusion layer which is formed on the semiconductor layer of the first region, a first source region and a first drain region formed on the first diffusion layer, a second diffusion layer formed on the semiconductor layer of the second region, a second source region and a second drain region formed on the second region, a third diffusion layer which is formed on the semiconductor layer of the third region and whose impurity concentration is higher than the first diffusion layer, a first insulation layer formed above the semiconductor layer of the forming region of the nonvolatile memory element, and a first conductive layer provided above the first insulation layer.

In the second semiconductor device according to an aspect of the invention, it is preferable that the third diffusion layer whose impurity concentration is higher than the first diffusion layer is provided. Namely, the first diffusion layer has an impurity concentration lower than the third diffusion layer. This enables voltage resistance to be enhanced.

(12) In the second semiconductor device according to an aspect of the invention, it is preferable that the first diffusion layer has the first conductive type, the first source region and the first drain region having the second conductive type, the second diffusion layer having the second conductive type, the second source region and the second drain region having the first conductive type, and the third diffusion layer having the first conductive type.

(13) In the semiconductor device according to an aspect of the invention, it is preferable that the first conductive type is an n-type, the second conductive type being a p-type.

BRIEF DESCRIPTION OF THE DRAWINGS

The invention will be described with reference to the accompanying drawings, wherein like numbers refer to like elements.

DESCRIPTION OF THE EMBODIMENTS

One example of the embodiments of the invention will be described as follows with reference to the drawings.

1. First Embodiment 1.1. First Example

Figure 1:
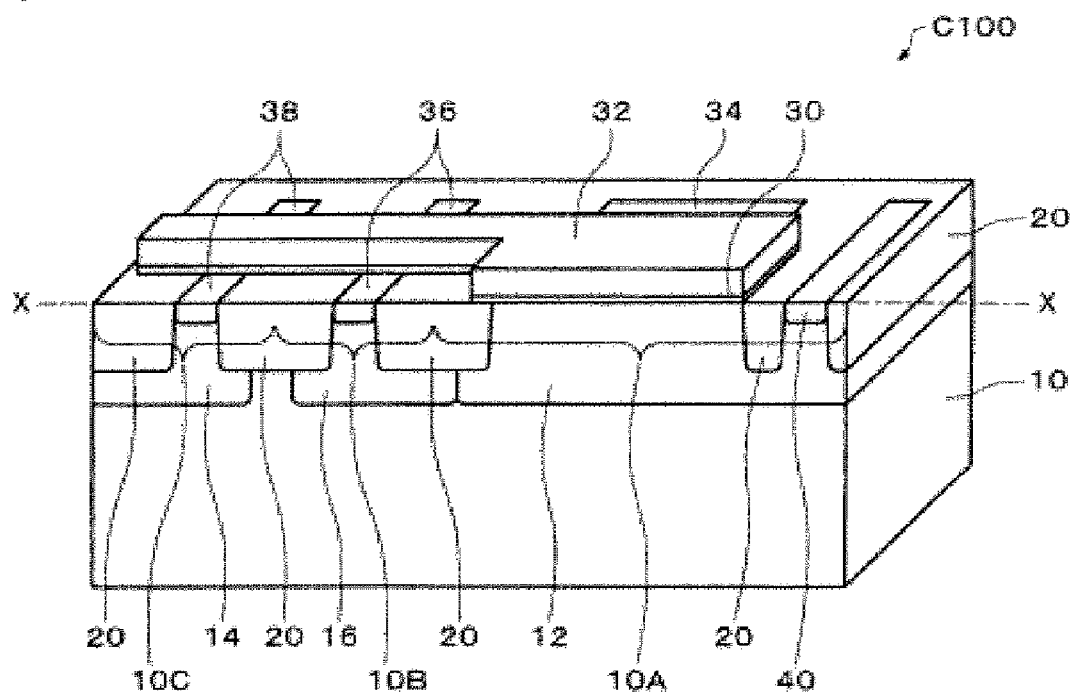
FIG. 1 is a diagram to explain a semiconductor device according to a first example of a first embodiment.
Figure 2:
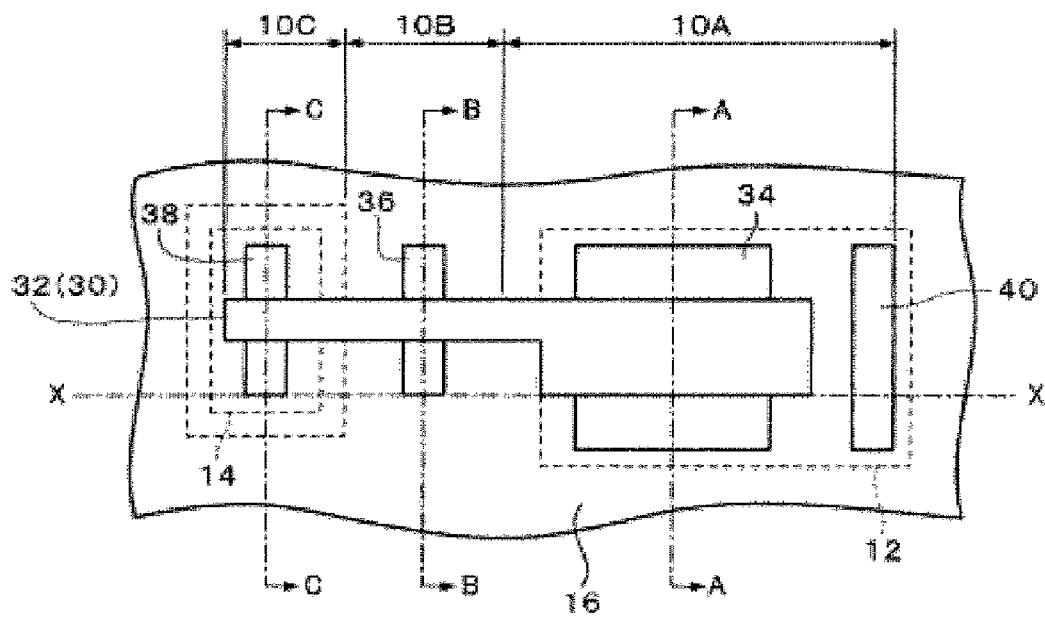
FIG. 2 is a diagram to explain a semiconductor device according to a first example of a first embodiment.
Figure 3:
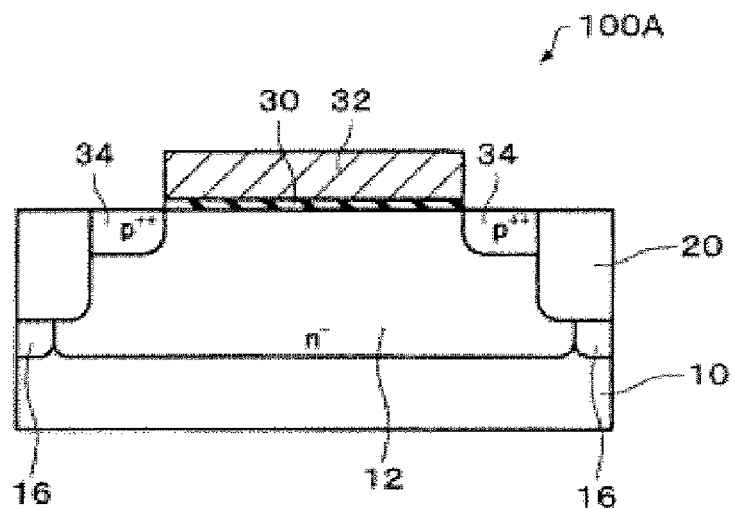
FIG. 3 is a diagram to explain a semiconductor device according to a first example of a first embodiment.
Figure 3:
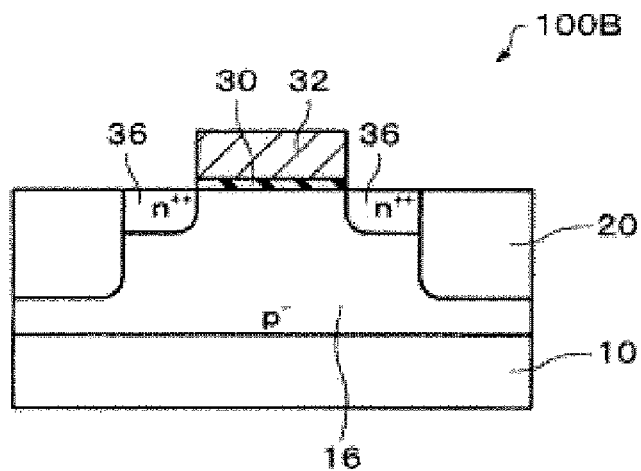
Figure 3:
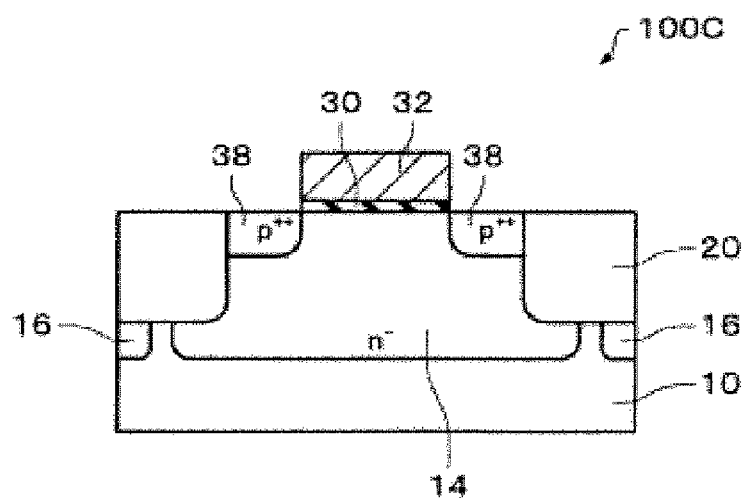

A nonvolatile memory element (hereinafter also referred to as the "Memory Cell") included in a semiconductor device according to a first example of an embodiment will be described below with reference to FIGS. 1 to 3. FIG. 1 is a perspective view showing a memory cell C100 included in a semiconductor device of the embodiment. FIG. 2 is a plan view showing an arrangement of a floating gate electrode 32 of the memory cell C100 and impurity regions. FIG. 3A is a sectional view along line A-A of FIG. 2. FIG. 3B is a section along line B-B of FIG. 2. FIG. 3C is a sectional view along line C-C of FIG. 2. Note that line X-X of FIG. 1 corresponds to line X-X of FIG. 2.

As shown in FIG. 1, the memory cell C100 according to the embodiment is provided on a p-type semiconductor layer 10. On the semiconductor layer 10, a region 10A (corresponding to "a third region"), a region 10B (corresponding to "a second region"), and a region C (corresponding to "a first region") are demarcated by a separating insulation layer 20. On the region 10-A is provided a n-type well 12 (corresponding to "a third diffusion layer"). On the region 10-C is provided a n-type well 14 (corresponding to "a first diffusion layer"). On the region 10-B is provided a p-type well 16 (corresponding to "a second diffusion layer").

As shown in FIG. 1 and FIG. 2, the n-type well 12 and the p-type well 16 are provided such that one periphery abuts another, while the n-type well 14 and the p-type well 16 are provided such as to be separate from each other. Normally, formation of the p-type well 16 is made by implanting an impurity by using a mask which inverted a mask used when forming n-type wells 12 and 14, so that the n-type well abuts the p-type well. However, in the embodiment, the p-type well 16 is formed by using a mask of a different pattern from the inverted mask of the n-type wells 12 and 14, so that the p-type well 16 separate from the n-type well 14 is provided.

The n-type well 12 of the region 10A performs a role of a control gate of the memory cell C100. The region 10B is a write section where electron implantation is performed to a floating gate electrode 32 to be explained later. The region 10C is an erase section for releasing an electron implanted into the floating gate electrode 32. A sectional structure of each region will be described later.

On the semiconductor layer 10 of the regions 10A to 10C, an insulation layer 30 is provided. On the insulation layer 30 is provided the floating gate electrode 32 over the region 10A to the region 10C. Further, at the region 10A is provided an n-type impurity region 40 on a region where the floating gate electrode 32 is provided and a region separated by a separating insulation layer 20. The n-type impurity region 40 may be set as a contact area for impressing a voltage when writing in the n-type well 12 which is a control gate.

At the region 10A, as shown in FIGS. 1 and 2, a p-type impurity region 34 is provided at a position of holding the floating gate electrode 32 in between. Likewise, at the region 10B, an n-type impurity region 36 is provided with the floating gate electrode 32 held in between. At the region 10C, a p-type impurity region 38 is provided with the floating gate electrode 32 held in between.

Next, a sectional structure of each region will be described.

As shown in FIG. 3A, at the region 10A, a p-channel transistor 100A is provided. The p-channel transistor 100A has the insulation layer 30 provided on the n-type well 12, the floating gate electrode 32 provided on the insulation layer 30, and the impurity region 34 provided on the n-type well 12. The impurity region 34 becomes a source region or a drain region.

As shown in FIG. 3B, on the region 10B is provided an n-channel MOS transistor 100B to perform a write operation on the memory cell C100. The n-channel transistor 100B has the insulation layer 30 provided on the p-type semiconductor layer 10, the floating gate electrode 32 provided on the insulation layer 30, and an impurity region 36 provided on the semiconductor layer 10. The impurity region 36 becomes the source region or the drain region.

As shown in FIG. 3C, on the region 10C is provided a p-channel transistor 100C. The p-channel transistor 100C has the insulation layer 30 provided on the n-type well 14, the floating gate electrode 32 provided on the insulation layer 30, and an impurity layer 38 provided on the n-type well 14. The impurity region 38 becomes the source region or the drain region.

At a semiconductor device according to a first example, voltage corresponding to a ratio of a capacitance between the floating gate electrode 32 of the region 10A and the n-type well 12 to a capacitance between the floating gate electrode 32 of the region 10B and the p-type semiconductor layer 10 is impressed on the floating gate electrode 32. Namely, the voltage of a value obtained by multiplying the voltage impressed on the control gate by the capacitance ratio is impressed on the floating gate electrode 32.

As a result, to perform the write operation efficiently, it is preferable that an area in which the floating gate electrode 32 overlaying the n-type well 12 that is the control gate is larger than an area in which the semiconductor layer 10 of the region 10B where the write operation is performed overlaying the floating gate electrode 32. For example, the overlaying area (a first area) of the floating gate electrode 32 and the n-type well 12 that is the control gate and the overlaying area (a second area) of the floating gate electrode 32 from the region 10A to the region 10C and the semiconductor 10 can be set such that the first area: the second area=6:10 to 9:10.

1.2 Second Example

Figure 5:
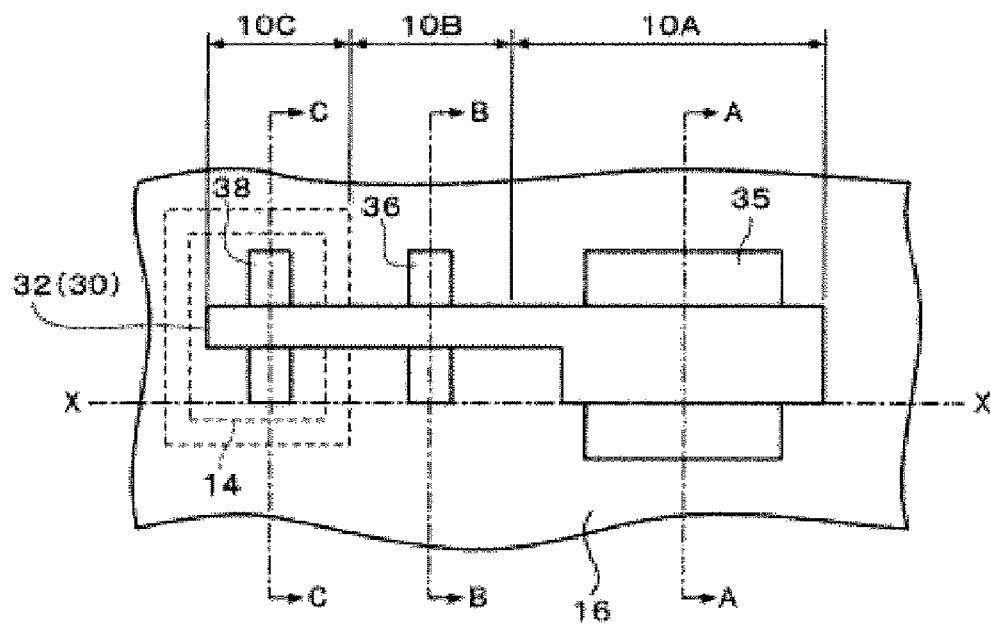
FIG. 5 is a diagram to explain a semiconductor device according to a second example of a first embodiment.
Figure 6:
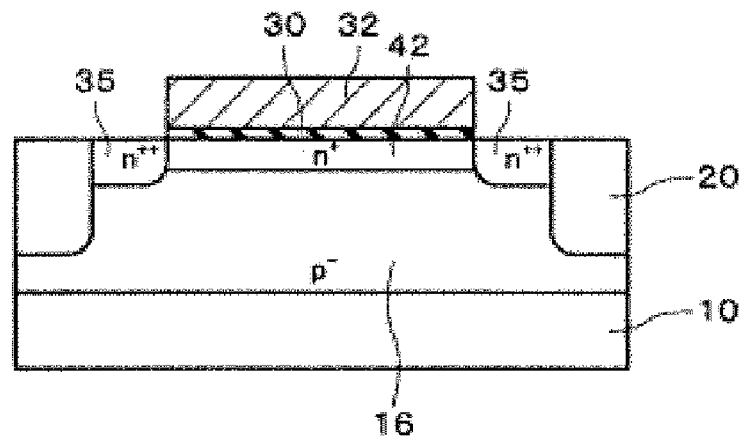
FIG. 6 is a diagram to explain a semiconductor device according to a second example of a first embodiment.
Figure 6:
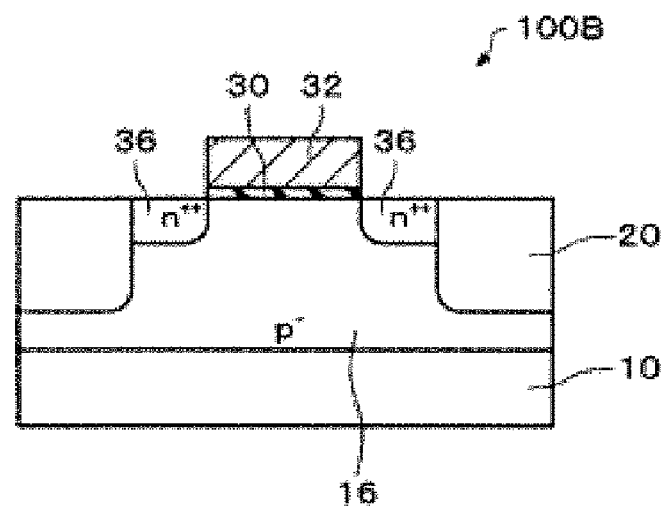
Figure 6:
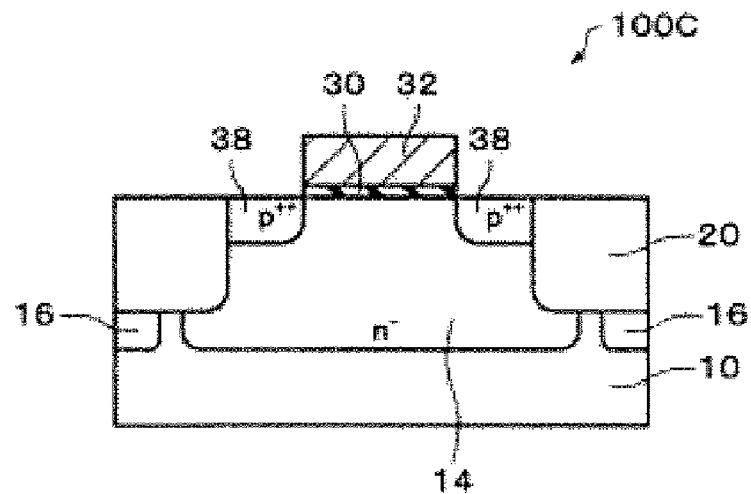

Next, a second example of the first embodiment will be described with reference to FIG. 4 to FIG. 6. A semiconductor device according to the second example is an example of a different structure of the control gate section by comparison to the first example. Specifically, in a nonvolatile memory device according to the second example, the n-type impurity region provided below the floating gate electrode 32 being set as the control gate is what is different from the first embodiment.

FG. 4 is a perspective view showing a memory cell C100 which is a nonvolatile memory device of the embodiment. FIG. 5 is a plan view of an arrangement of a floating gate electrode 32 of the memory cell 100 and various impurity regions 35, 36, 38, and the like. FIG. 6A is a sectional view along line A-A of FIG. 5. FIG. 6B is a section along line B-B of FIG. 5. FIG. 6C is a sectional view along line C-C of FIG. 5. Note that detailed description of members whose structures are the same as the first embodiment will be omitted.

Figure 4:
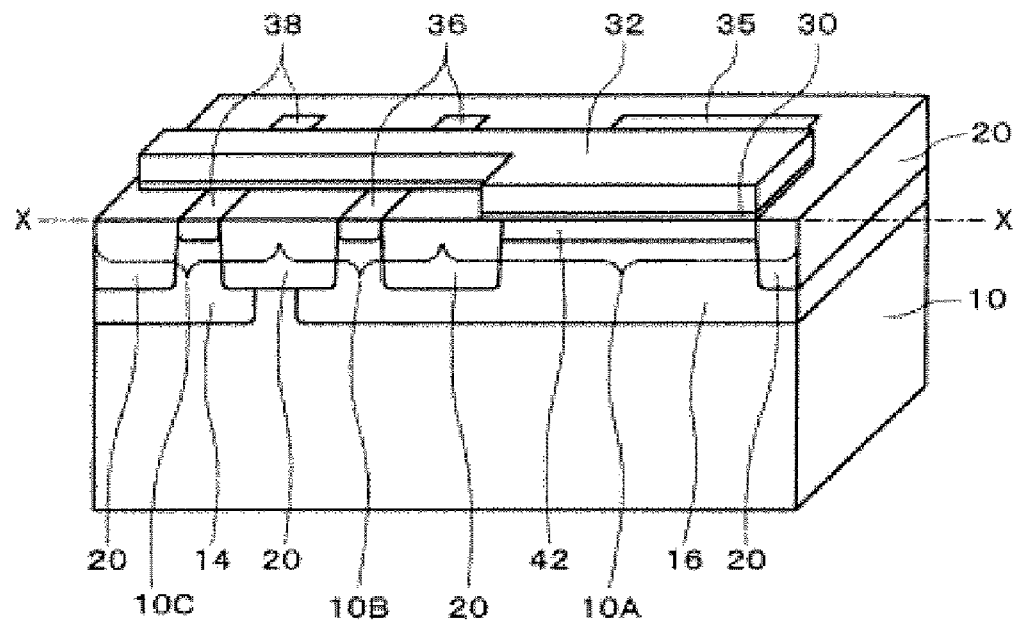
FIG. 4 is a diagram to explain a semiconductor device according to a second example of a first embodiment.

As shown in FIG. 4, a semiconductor device according to the second example is provided on the p-type semiconductor layer 10 in the same way as the semiconductor device according to the first example. The semiconductor layer 10 is separated and demarcated into the region 10A, the region 10B, and the region 10C by the separating insulation layer 20. On the region 10A and the region 10B, the p-type well 16 is provided, and on the region C, the n-type well 14 is provided.

As apparent from FIG. 1 and FIG. 2, the n-type well 14 and the n-type well 16 are provided separate from each other. Namely, at a boundary between the n-type well 14 and the n-type well 16, the semiconductor layer 10 which is a substrate is provided. Note that the region 10A is a control gate section in the same way as the first embodiment, the region 10-G being a write section, and the region 10C being an erase section.

As shown in FIG. 4, the insulation layer 30 is provided on the semiconductor layer 10 of the region 10A to the region 10C. The floating gate electrode 32 which is provided from the region 10A to the region 10C is set up on the insulation layer 30. The n-type impurity region 35 is provided on the region 10A, as shown in FIGS. 4 and 5, in a manner of holding the floating gate electrode 32 in between. The p-type impurity region 36 is provided on the region 10B in a manner of holding the floating gate electrode 32 in between. The n-type impurity region 38 is provided on the region 10C in a manner of holding the floating gate electrode 32 in between.

Next, the sectional structures of respective regions will be described with reference to FIG. 6A to FIG. 6C.

As shown in FIG. 6A, the region 10A has the insulation layer 30 provided on the p-type well 16, the floating gate electrode 32 provided on the insulation layer 30, and the impurity region 35. The impurity region 35 becomes a contact section to the n-type impurity region (control gate) 42. As shown in FIG. 6B, on the region 10B, there is provided the n-channel MOS transistor 100B to perform the write operation on the memory cell C100. The n-channel MOS transistor 100B is the same as the first example.

As shown in FIG. 6C, the p-channel MOS transistor 100C is provided on the region 10C. The p-channel MOS transistor 100C is the same as the p-channel MOS transistor 100C described in the first example.

According to a semiconductor device of the first embodiment, the p-channel MOS transistor 100C used when erasing (releasing the electron implanted into the floating gate electrode 32) is provided on the n-type well 14 separated from the p-type well 16. Consequently, the p-type semiconductor layer 10 which is a substrate itself is provided in the periphery of the n-type well 14. The p-type semiconductor layer 10 which is the substrate has a lower impurity concentration than the p-type well 16, hence, being capable of reducing the junction capacitance between the n-type well 14 and the p-type semiconductor 10 and leading to enhancing the voltage resistance of the n-type well 14. This makes it possible, at the time of erasing, to impress a high voltage, thus shortening erase time. As a result, it is possible to provide a semiconductor device including the memory cell C100 which has especially improved operating characteristics when erasing.

Further, according to a semiconductor device of the second example, a n-type first impurity region 42 below the floating gate electrode 32 of the region 10A performs a role of the control gate. Hence, miniaturization can be produced by comparison to a semiconductor device according to the first example in which the entire n-type well 12 is the control gate.

2. Second Embodiment

Figure 7:
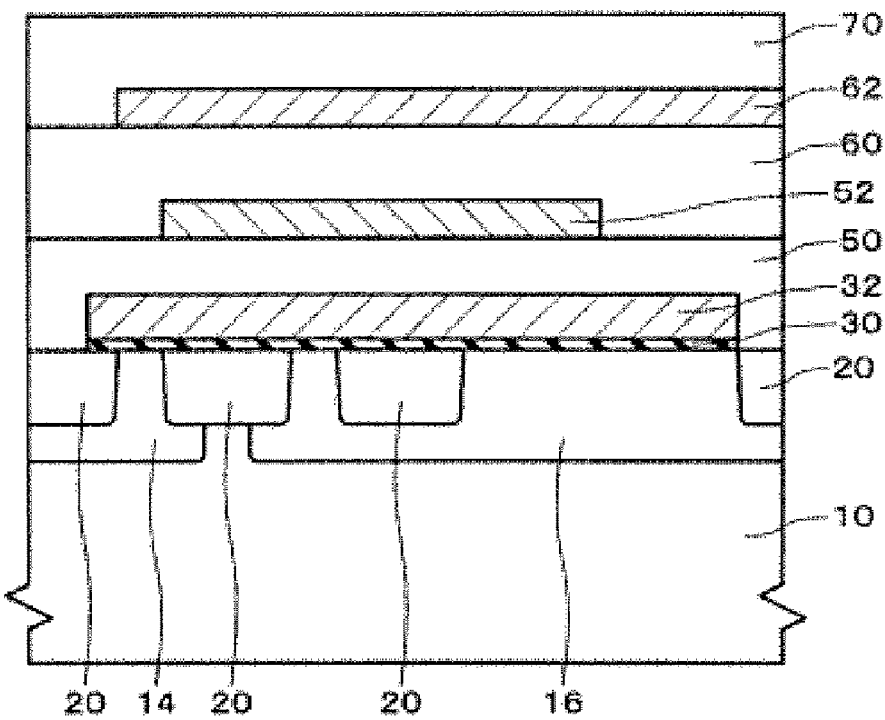
FIG. 7 is a diagram to explain a semiconductor device according to a second embodiment.

Next, a semiconductor device according to a second embodiment will be described with reference to the drawings. FIG. 7 is a schematic sectional view of a semiconductor device according to a second embodiment, showing a section corresponding to line I-I of FIG. 5. The second embodiment is an example of providing an inversion preventing layer above a separated part between the n-type well 14 and the adjacent p-type well 16 in the semiconductor device according to the first embodiment.

As shown in FIG. 7, the semiconductor device according to the second embodiment is such that a first interlayer insulation layer 50, a second interlayer insulation layer 60, and a third interlayer insulation layer 70 are consecutively provided above the memory cell C100 in a manner of covering the floating gate electrode 32. Over the first interlayer insulation layer 50 is provided a first layer conductive layer (wiring layer) 52, and over the second interlayer insulation layer 60 is provided a second layer conductive layer (wiring layer) 62.

The conductive layer 623, though not shown in a section illustrated in FIG. 7, is electrically connected to the p-channel transistor 100C of the region 10C, being used as an erase signal line. On the other hand, the conductive layer 52 is connected to the ground (GND), having a preset pattern so as to be provided at least above the separated part.

Namely, the conductive layer 52 is provided in a manner of covering the semiconductor layer which is free from implantation of the impurity that may generate as separation between the n-type well 14 and the p-type well 16 occurs (hereinafter referred to as the "separated part"). In other words, of the conductive layer 52, a portion provided above the separated part serves to function the role as the inversion preventing layer.

According to the semiconductor device of the second embodiment, the device has the same advantage as the semiconductor device of the first embodiment, providing in particular a semiconductor device with enhanced operating characteristics when erasing. Further, the conductive layer 52 connected to the ground covers the separated part, so that even if a high voltage is impressed for erasing, inversion of the semiconductor layer 10 to generate a leak channel can be restricted. Further, since the erase signal line is composed of a second layer conductive layer 62, a fixed gap can be set up between the semiconductor layer 10 and the conductive layer 62, thus further enhancing effects of preventing inversion. As a result, while maintaining reliability, the erase voltage can be made high, thus making it possible to provide a semiconductor device in which the erase time is shortened.

It should be noted that a case where the inversion preventing layer is provided in the second example of the first embodiment was described in the second embodiment. However, it is not limited to this and application may be made to the semiconductor device of the first example of the first embodiment. Further, as the erase signal line, a case where the second layer conductive layer 62 is used is described. However, it is not limited to this and a conductive layer of more than a third layer may be used.

3. Third Embodiment

Figure 8:
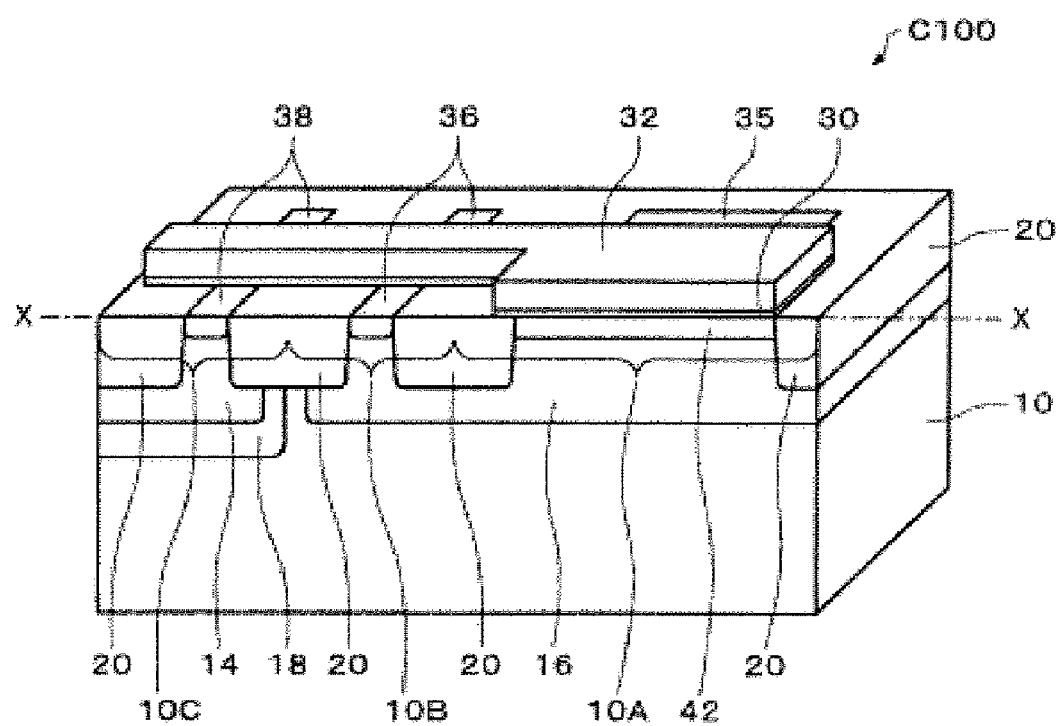
FIG. 8 is a diagram to explain a semiconductor device according to a third embodiment.
Figure 9:
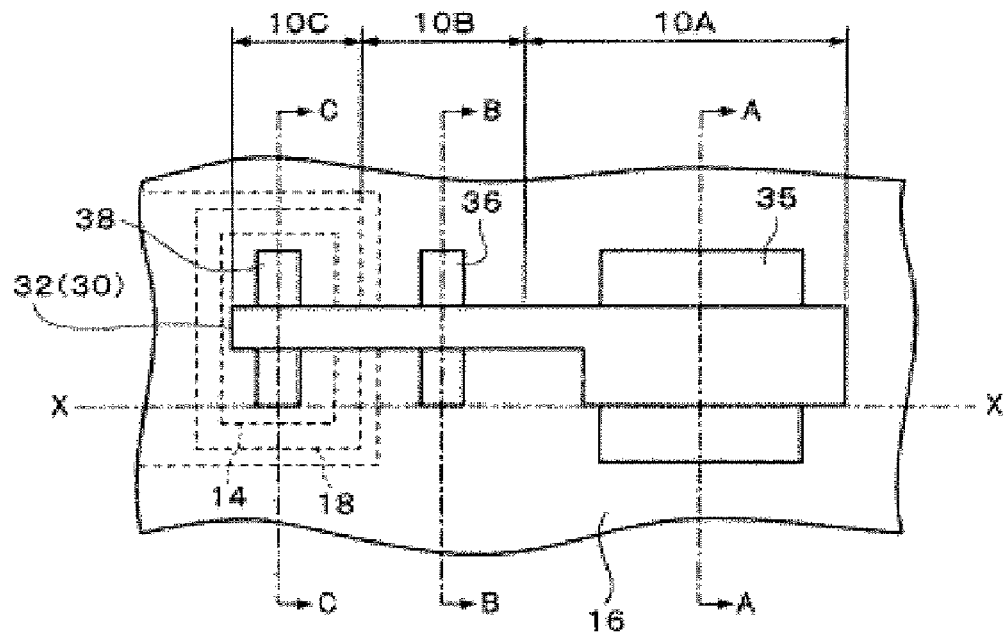
FIG. 9 is a diagram to explain a semiconductor device according to a third embodiment.

Next, a semiconductor device according to a third embodiment will be described with reference to FIGS. 8 and 9. FIG. 8 is a perspective view showing schematically a semiconductor device according to a third embodiment. FIG. 9 is a plan view showing schematically positional relationships of the floating gate electrode 32 and various impurity regions. Note that in the third embodiment, description will be made of different points from the first embodiment, taking, for example, the memory cell C100 having the same structure as the semiconductor device according to the second example of the first embodiment referenced above.

In the third embodiment, what is different is that an n-type low concentration impurity layer 18 (corresponding to the "fourth diffusion layer") is provided in a manner of surrounding the n-type well 14 of the region 10C. As compared to the n-type well 14, the low-concentration impurity layer 18 can be formed using the same process as a forming process of a low concentration impurity layer (drain over or drain offset) surrounding a drain region of a high voltage-resistant MOS transistor (not illustrated) mixedly mounted on the same semiconductor layer as the memory cell C100 according to the embodiment.

According to the semiconductor device of the third embodiment, the p-channel MOS transistor 100C is used when erasing is provided in the n-type well 14 around which the low concentration impurity layer 18 is arranged. This enables voltage resistance of the n-type well 14 to be increased, and when erasing, a high voltage can be impressed. As a result, the erase time can be shortened.

Consequently, it is possible to provide a semiconductor device including a nonvolatile memory element whose operating characteristics particularly when erasing is enhanced. Note that in the third embodiment, a case where the low concentration impurity layer 18 is provided in a semiconductor device according to the second example of the first embodiment is described. It is not limited to this, and application may be made to the semiconductor device according to the first example of the first embodiment.

4. Fourth Embodiment

Figure 10:
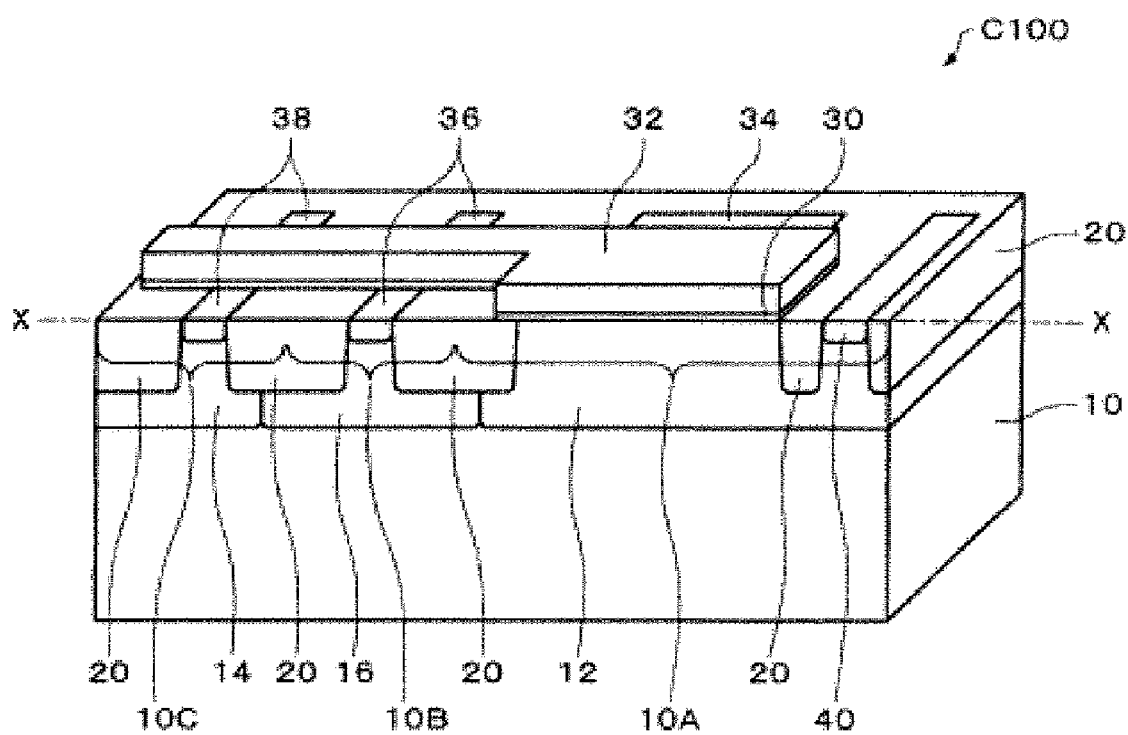
FIG. 10 is a diagram to explain a semiconductor device according to a fourth embodiment.
Figure 11:
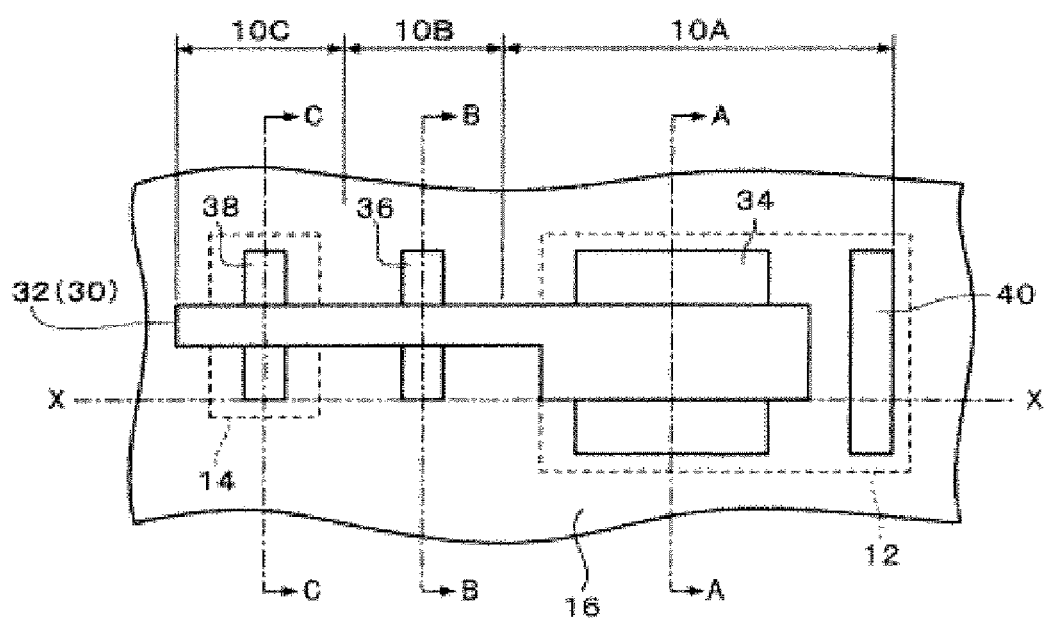
FIG. 11 is a diagram to explain a semiconductor device according to a fourth embodiment.

Next, a semiconductor device according to a fourth embodiment will be described with reference to FIGS. 10 and 11. FIG. 10 is a perspective view showing schematically a semiconductor device according to a fourth embodiment. FIG. 11 is a plan view showing schematically positional relationships of the floating gate electrode 32 and various impurity regions. Note that in the fourth embodiment, description will be made of different points from the first embodiment, taking, for example, the same structure as the semiconductor device according to the first example of the first embodiment referenced above.

In the fourth embodiment, what is different is that the n-type well 12 of the region A and the n-type well 14 of the region 10C have different impurity concentrations. Specifically, the n-type well 14 is a layer having a lower impurity concentration than the n-type well 12.

According to a semiconductor device of the fourth embodiment, the p-channel MOS transistor 100C used when erasing is provided in the n-type well 14 of low impurity concentration by comparison to the n-type well 14 of the region 10A. As a result, it is possible to reduce junction capacitance with a p-type semiconductor region such as the adjacent p-type well by comparison to a case where it is formed of the same impurity concentration.

Consequently, this enables junction capacitance with a p-type semiconductor region such as the adjacent p-type well to be reduced by comparison to a case of forming with the same impurity concentration as the n-type well 12. As a result, a high voltage can be impressed, thus shortening the erase time. Accordingly, it is possible to provide a semiconductor device including a nonvolatile memory element whose operating characteristics particularly when erasing is enhanced. Note that in the fourth embodiment, a case where the embodiment is applied to a semiconductor device according to the first example of the first embodiment is described. It is not limited to this, and application may be made to the semiconductor device according to the second example of the first embodiment.

It should be noted that the invention is not limited to the embodiments referenced above, but a various modifications are possible. For example, the invention includes constitutions which are virtually the same as the constitutions described in the embodiments (for example, a constitution having the same function, method, and result, or a constitution having the same purpose and result). Further, the invention includes constitutions in which sections not essential to the constitutions described in the embodiments are replaced. Still further, the invention includes constitutions having the constitutions producing the same operation working-effect or constitutions capable of achieving the same purpose as the constitutions described in the embodiment. Furthermore, the invention includes constitutions which consist of the constitutions described in the embodiments added with publicly known techniques.

What is claimed is:

1. A semiconductor device including a nonvolatile memory element, the nonvolatile memory element, comprising:
    a first region, a second region formed adjacent to the first region, and a third region formed adjacent to the second region;
    the nonvolatile memory element further including a semiconductor layer, a separating insulation layer which is formed in the semiconductor layer and which demarcates a forming region of the nonvolatile memory element,
    a first well which is formed in the semiconductor layer of the first region,
    a first source region and a first drain region formed within the first well,
    a second well which is separated from the first well, which surrounds the first well, and which is formed on a periphery of the first well and in the semiconductor layer of the second region,
    a second source region and a second drain region formed within the second well,
    a third well formed in the semiconductor layer of the third region,
    a first insulation layer formed above the semiconductor layer of the forming region of the nonvolatile memory element that continuously crosses the first, second, and third regions, and
    a first conductive layer formed above the first insulation layer functioning as a floating gate electrode that continuously crosses the first, second, and third regions,
    a first area where the first conductive layer overlaps the third well being greater than a second area where the first conductive layer overlaps the semiconductor layer of the second region,
    the third well and the second well being made continuous with each other.

2. The semiconductor device according to claim 1, wherein the first well has a first conductive type, the second well having a second conductive type.

3. The semiconductor device according to claim 2, wherein the first source region and the first drain region have the second conductive type, the second source region and the second drain region having the first conductive type.

4. The semiconductor device according to claim 3, wherein the third well has the first conductive type.

5. The semiconductor device according to claim 3, wherein the third well has the second conductive type.

6. The semiconductor device according to claim 2, wherein the first conductive type is an n-type, while the second conductive type is a p-type.

7. The semiconductor device according to claim 1, wherein a diffusion layer whose impurity concentration is lower than the first well is formed in a manner of surrounding the first well.

8. The semiconductor device according to claim 7, wherein the diffusion layer is separated from the second well.

9. The semiconductor device according to claim 7, wherein the diffusion layer has the first conductive type.

10. The semiconductor device according to claim 1, wherein a second insulation layer formed above the first conductive layer and a second conductive layer which is above a region between the first well and the second well and which is formed above the second insulation layer are included.

11. A semiconductor device including a nonvolatile memory element, the nonvolatile memory element, comprising:
    a first region, a second region formed adjacent to the first region, and a third region formed adjacent to the second region;
    the nonvolatile memory element further including a semiconductor layer,
    a separating insulation layer which is formed on the semiconductor layer and which demarcates a forming region of the nonvolatile memory element,
    a first well which is formed in the semiconductor layer of the first region,
    a first source region and a first drain region formed on the first well,
    a second well formed in the semiconductor layer of the second region, the second well surrounding the first well and being isolated from the first well,
    a second source region and a second drain region formed on the second region,
    a third well which is formed in the semiconductor layer of the third region and whose impurity concentration is higher than the first well,
    a first insulation layer formed above the semiconductor layer of the forming region of the nonvolatile memory element that continuously crosses the first, second, and third regions, and
    a first conductive layer provided above the first insulation layer functioning as a floating gate electrode that continuously crosses the first, second, and third regions,
    a first area where the first conductive layer overlaps the third well being greater than a second area where the first conductive layer overlaps the second region,
    the first well having the first conductive type, the first source region and the first drain region having the second conductive type, the second well having the second conductive type, the second source region and the second drain region having the first conductive type, the third well having the first conductive type, and the third well and the second well being made continuous with each other.

* * * * *